(12) United States Patent
Shih

(10) Patent No.: US 8,405,083 B2
(45) Date of Patent: Mar. 26, 2013

(54) THIN FILM TRANSISTOR ARRAY SUBSTRATE

(75) Inventor: Mei-Sha Shih, Kaohsiung (TW)

(73) Assignee: Chunghwa Picture Tubes, Ltd., Taoyuan (TW)

(*) Notice: Subject to any disclaimer, the term of this patent is extended or adjusted under 35 U.S.C. 154(b) by 617 days.

(21) Appl. No.: 12/267,623

(22) Filed: Nov. 10, 2008

(65) Prior Publication Data
US 2010/0044715 A1    Feb. 25, 2010

(30) Foreign Application Priority Data
Aug. 20, 2008 (TW) .............................. 97131834 A

(51) Int. Cl.
*H01L 33/00* (2010.01)
(52) U.S. Cl. ............... 257/59; 257/797; 257/E33.056
(58) Field of Classification Search .............. 257/59, 257/72, 797
See application file for complete search history.

(56) References Cited

U.S. PATENT DOCUMENTS
6,717,629 B2   4/2004  Takasaki et al.
7,110,057 B2 * 9/2006  Jeon ............................... 349/40
2003/0146694 A1 * 8/2003  Lee et al. ....................... 313/505
2005/0077517 A1 * 4/2005  Chang et al. .................... 257/59
2005/0225710 A1  10/2005  Yi FOREIGN PATENT DOCUMENTS
JP   03-060437     3/1991
JP   2006-134968   5/2006
TW       554196    9/2003
TW      200533991  10/2005
TW      200702863   1/2007

OTHER PUBLICATIONS
"First Office Action of China Counterpart Application", issued on Feb. 18, 2011, p. 1-p. 5.
"Office Action of Taiwan Counterpart Application", issued on Apr. 25, 2012, p. 1-p. 6.

* cited by examiner

*Primary Examiner* — Benjamin Sandvik
(74) *Attorney, Agent, or Firm* — Jianq Chyun IP Office

(57) ABSTRACT

A TFT array substrate including a substrate, a plurality of pixel structures and a plurality of cutting marks is provided. The substrate has a device region and a cutting mark region. The pixel structures are disposed in the device region and each pixel structure includes a TFT, a pixel electrode and a passivation layer covering the TFT. The cutting marks are within the cutting mark region, disposed at two sides of a predetermined cutting position, and are arranged as a row or column perpendicular to a predetermined cutting direction. In particular, the cutting marks are constituted of at least two colors, at least two shapes, at least one color and at least one shape, or a combination thereof.

11 Claims, 8 Drawing Sheets

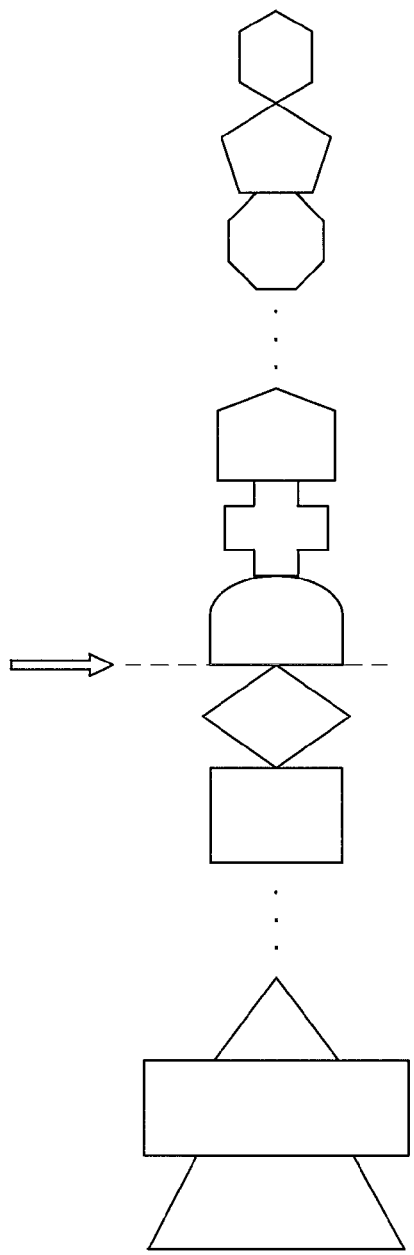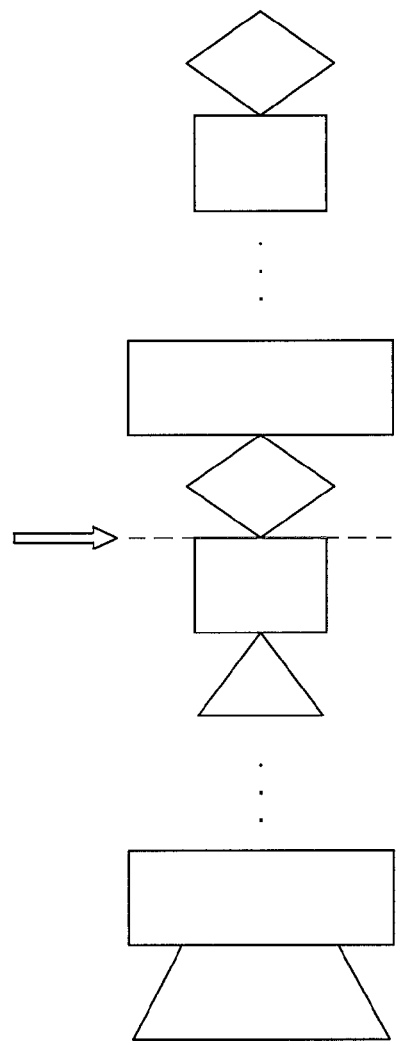

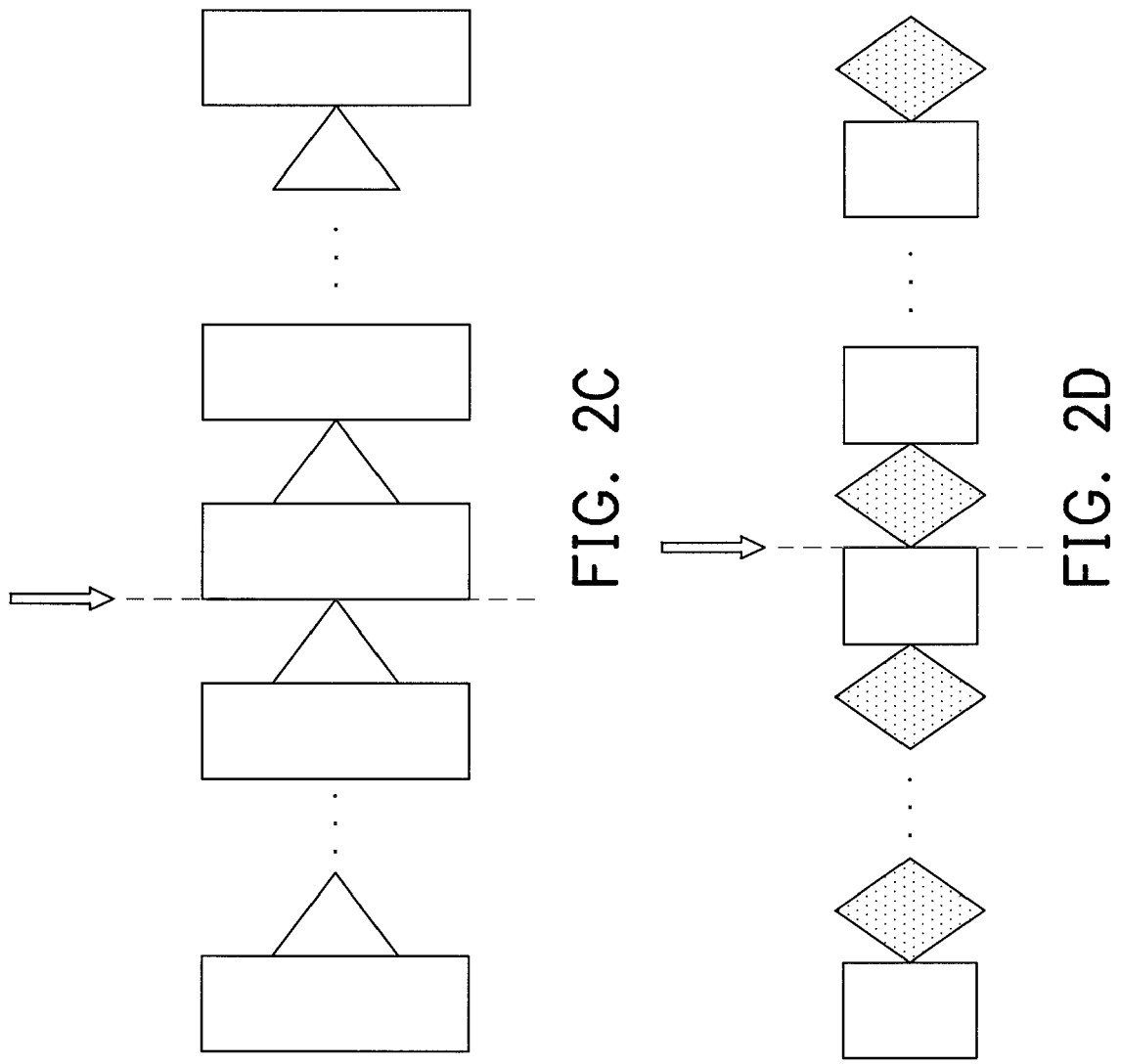

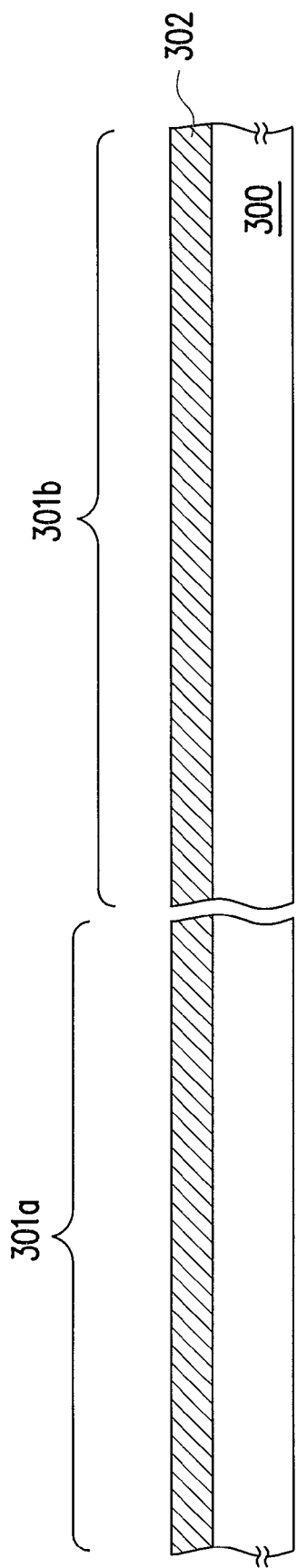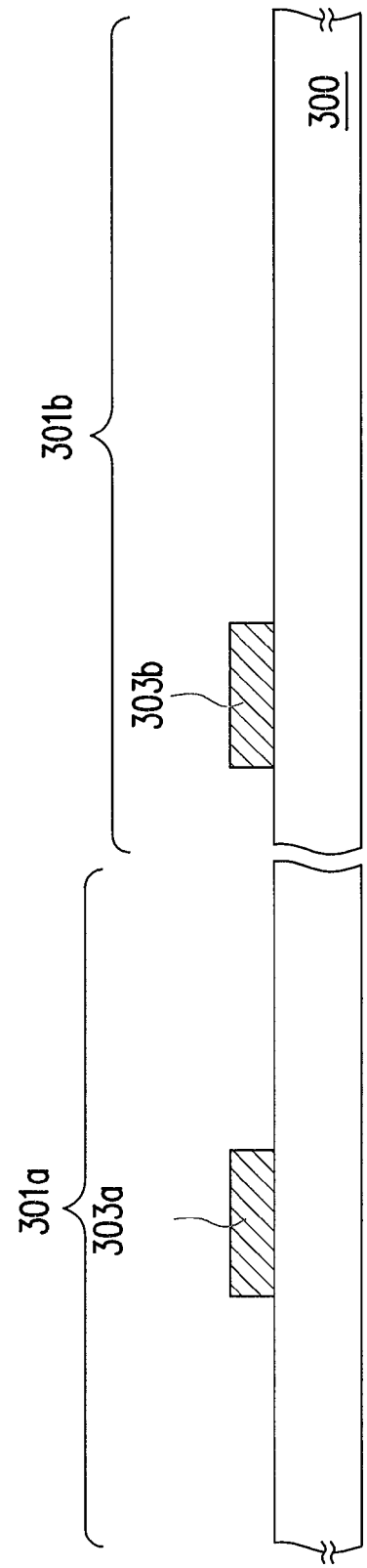
FIG. 3A
FIG. 3B

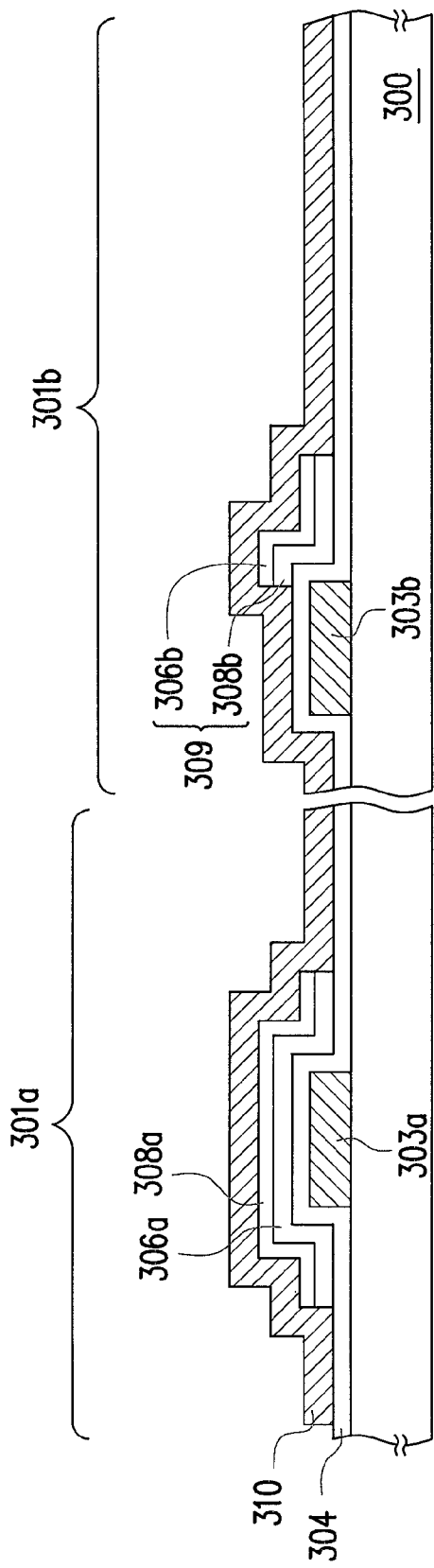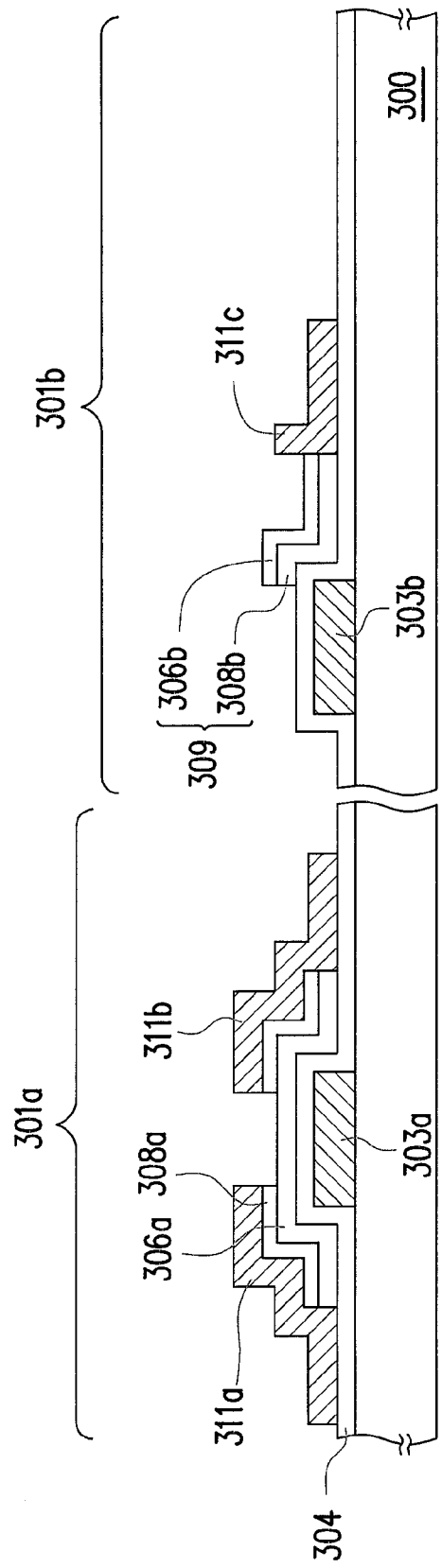

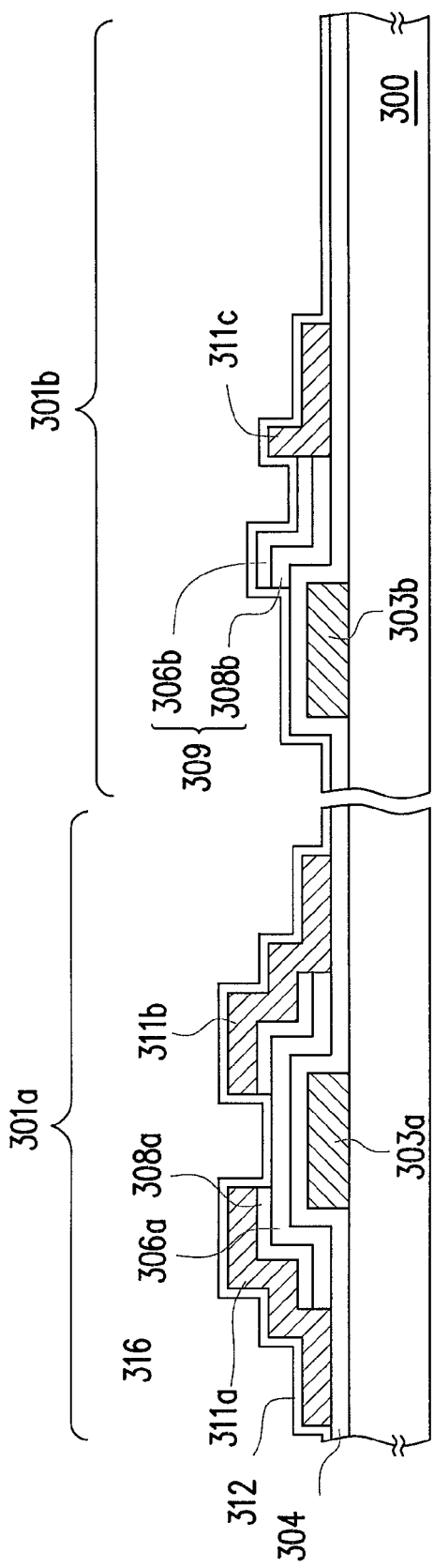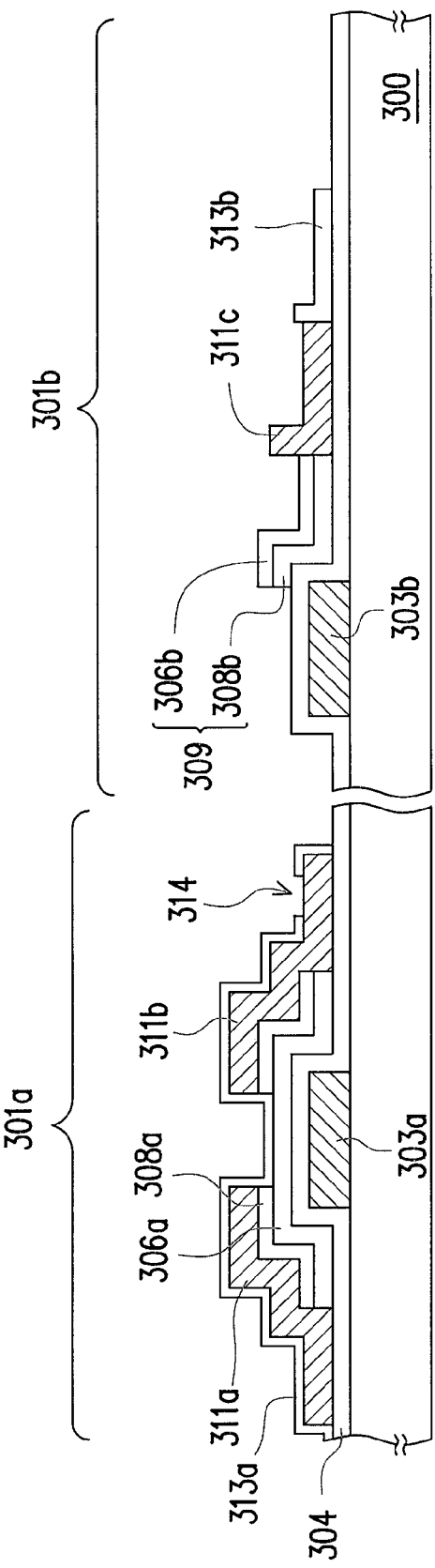

THIN FILM TRANSISTOR ARRAY SUBSTRATE

CROSS-REFERENCE TO RELATED APPLICATION

This application claims the priority benefit of Taiwan application serial no. 97131834, filed on Aug. 20, 2008. The entirety of the above-mentioned patent application is hereby incorporated by reference herein and made a part of this specification.

BACKGROUND OF THE INVENTION

1. Field of the Invention

The present invention relates to a thin film transistor (TFT) array substrate and a fabricating method thereof, and more particularly, to a thin film transistor array substrate having cutting marks thereon capable of increasing cutting accuracy and a fabricating method thereof.

2. Description of Related Art

The procedure of forming a thin film transistor liquid crystal display (TFT-LCD) is mainly divided into three stages: a TFT array process, a liquid crystal cell process and a module assembly process. The TFT array process includes performing depositing, exposing, developing and etching steps on a substrate so as to form a TFT array substrate. The liquid crystal cell process includes performing alignment treatments on the TFT array substrate and a color filter substrate, bonding the two substrates, cutting panel, injecting liquid crystal, attaching polarizers on the substrates and performing inspecting steps. The module assembly process comprises assembling the cut TFT-LCD panel, driving ICs, print circuit boards, backlight and other components together to form a final product. Thereafter, an inspecting or testing step is conducted to the final product.

With thriving of the electronics industry in recent years, the yields of the TFT array process and the module assembly process are up to 95% or more. However, the liquid crystal cell process is more difficult and has low yield in the procedure of forming the TFT-LCD.

In particular, the cutting step in the liquid crystal cell process critically affects the yield thereof. With increasing the process throughput and the device density, the high cutting accuracy of the display panel is required.

In addition, U.S. Pat. No. 6,717,629, TW 200702863 and TW 554196 disclose some cutting marks for the display panel cutting process. The entire contents of the above documents are incorporated herein as references to this present application.

SUMMARY OF THE INVENTION

The present invention directly relates to a TFT array substrate having cutting marks thereon capable of increasing cutting accuracy.

The present invention directly relates to a method of fabricating a TFT array substrate capable of forming cutting marks easily and increasing cutting accuracy.

A TFT array substrate including a substrate, a plurality of pixel structures and a plurality of cutting marks is provided. The substrate comprises a device region and a cutting mark region. The pixel structures are disposed in the device region and each pixel structure comprises a TFT, a pixel electrode and a passivation layer covering the TFT. The cutting marks are within the cutting mark region, disposed at two sides of a predetermined cutting position, and are arranged as a row or column perpendicular to a predetermined cutting direction. In particular, the cutting marks are constituted of at least two colors, at least two shapes, at least one color and at least one shape, or a combination thereof.

In an embodiment of the present invention, the cutting marks have the same shape but have different colors.

In an embodiment of the present invention, the cutting marks have different shapes.

In an embodiment of the present invention, parts of the cutting marks have the same shape and the other parts of the cutting marks have different shapes.

In an embodiment of the present invention, the distance between each cutting mark and the predetermined cutting position is a multiple of a constant.

In an embodiment of the present invention, the cutting marks are arranged alternatively based on their materials.

In an embodiment of the present invention, the cutting marks are arranged alternatively based on their shapes.

In an embodiment of the present invention, the material of a portion of the cutting marks is the same to that of the gate of the TFT.

In an embodiment of the present invention, the material of a portion of the cutting marks is the same to that of the semiconductor layer of the TFT.

In an embodiment of the present invention, the material of a portion of the cutting marks is the same to that of the source and drain of the TFT.

In an embodiment of the present invention, the material of a portion of the cutting marks is the same to that of the passivation layer.

In an embodiment of the present invention, the material of a portion of the cutting marks is the same to that of the pixel electrode.

A fabrication method for a TFT array substrate is also proviced. A substrate having a device region and a cutting mark region is provided. A first conductive layer is formed on the substrate. The first conductive layer is patterned to form a plurality of gates within the device region and form at least a first cutting mark within the cutting mark region. Next, a dielectric layer and a semiconductor layer are sequentially formed on the substrate to cover the gates and the first cutting mark. The semiconductor layer is patterned to form a channel layer on the dielectric layer above each gate and form at least a second cutting mark on the dielectric layer within the cutting mark region simultaneously. Next, a second conductive layer is formed over the substrate. The second conductive layer is patterned to form a source and a drain over each of the gates and form at least a third cutting mark on the dielectric layer within the cutting mark region simultaneously. A passivation layer is formed over the substrate. The passivation layer is patterned to form a contact opening exposing each of the drains within the device region and form at least a fourth cutting mark on the dielectric layer within the cutting mark region simultaneously. Thereafter, a transparent conductive material layer is formed over the substrate. The transparent conductive material layer is patterned to form a plurality of pixel electrodes and form at least a fifth cutting mark on the dielectric layer within the cutting mark region simultaneously, wherein each of the pixel electrodes is electrically connected to the corresponding drain through one of the contact openings. These cutting marks are arranged as a row or column perpendicular to a predetermined cutting direction and disposed at two sides of a predetermined cutting position.

In an embodiment of the present invention, the first, second, third, fourth and fifth cutting marks have the same shape but have different colors.

In an embodiment of the present invention, the first, second, third, fourth and fifth cutting marks have different shapes.

In an embodiment of the present invention, parts of the first, second, third, fourth and fifth cutting marks have the same shape and the other parts have different shapes.

In an embodiment of the present invention, the distance between each cutting mark and the predetermined cutting position is a multiple of a constant.

In an embodiment of the present invention, the first, second, third, fourth and fifth cutting marks are arranged alternatively based on their materials.

In an embodiment of the present invention, the first, second, third, fourth and fifth cutting marks are arranged alternatively based on their shapes.

Because the TFT array substrate has a plurality of cutting marks having the combination of color and/or shape thereon, the position shift between an actual cutting position and the predetermined cutting position can be obtained through the cutting marks. Therefore, the cutting process can be adjusted according to the position shift so as to improve process yield. In addition, the cutting marks are formed when the patterning steps of the TFT array process are performed. Thus, the method of forming the cutting marks is easy and does not increase the manufacturing cost. Moreover, the cutting marks can also serve as alignment marks between the film layers so as to increase the aligning accuracy between the film layers.

To make the above-mentioned and other objectives, features, and advantages of the present invention more comprehensible, several embodiments accompanied with figures are detailed as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A-2D show cutting marks according to several embodiments of the invention.

FIGS. 3A-3J are cross-sectional views of a method of fabricating a TFT array substrate according to an embodiment of the invention.

DESCRIPTION OF EMBODIMENTS

Figure 1:
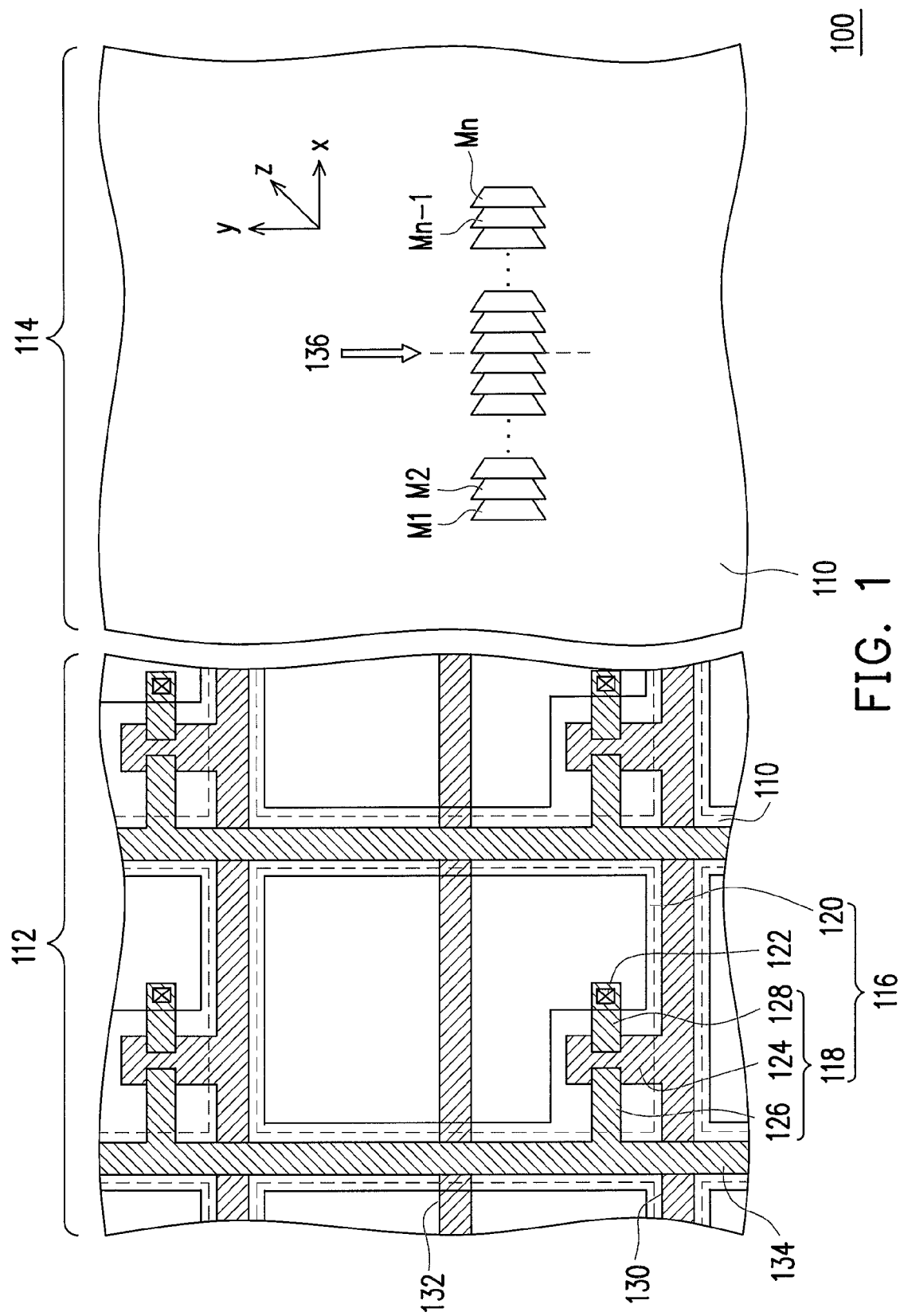
FIG. 1 is a top view of a thin film transistor array substrate according to an embodiment of the invention.

FIG. 1 is a top view of the thin film transistor array substrate according to an embodiment of the invention. Referring to FIG. 1, the TFT array substrate 100 comprises a substrate 110 having a device region 112 and a cutting mark region 114. The substrate 110 can be a glass substrate or other transparent substrate. A plurality of pixel structures 116 are disposed within the device region 112 of the substrate 110. Each of the pixel structures 116 comprises a TFT 118, a pixel electrode 120 and a passivation layer (not shown) covering the TFT 118. Each of the TFT 118 has a gate 124, a source 126 and a drain 128, and a semiconductor layer (not shown) is further disposed between the gate 124 and the source 126 and drain 128. The passivation layer has openings 122 exposing the drains 128, and the pixel electrodes 120 electrically connect the drains 128 through the contact openings 122. In addition, scan lines 130 electrically connected to the gates 124, common lines 132, and data lines 134 electrically connected to the sources 126 are further disposed within the device region 112 of the substrate 110.

In addition, a plurality of cutting marks M1, M2, M3 . . . Mn−1, Mn (n is a positive integer) are disposed within the cutting mark region 114 of the substrate 110. These cutting marks M1-Mn are disposed at two sides of a predetermined cutting position 136. The predetermined cutting direction is z direction and the cutting marks M1-Mn are arranged as a raw or column (along x direction) perpendicular to the predetermined cutting direction.

Additionally, the distance between each cutting mark M1-Mn and the predetermined cutting position 136 is a multiple of a constant, and thus each of the cutting marks serves as a specific scale. Therefore, a position shift can be obtained from comparing the actual cutting position and the cutting marks, and thus a cutting process is adjusted according to the position shift.

In the embodiment, the cutting marks M1-Mn have a shape of trapezoid for illustration. The present invention does not limit to this shape, and the cutting marks M1-Mn may have other shapes. In an embodiment, the cutting marks have the same shape but have different colors. For example, all of the cutting marks have the shape of rhombus, square, triangle or other polygon but they have different colors. In addition, as shown in FIG. 2A, the cutting marks have different shapes, or as shown in FIG. 2B, parts of the cutting marks have the same shape and the other parts have different shapes. Furthermore, as shown in FIG. 2C, the cutting marks are arranged alternatively based on their shapes. That is, the cutting marks having the same shape are not adjacent to each other.

It is noted that the position shift between the actual cutting position and the predetermined cutting position can be clearly shown through combining the shapes and colors of the cutting marks to serve as specific scales. In details, the cutting marks can be formed when forming pixel structures, for example. Therefore, the materials of the cutting marks can be the same with the gate, the semiconductor layer, or the source and drain of the TFT, or the same with the passivation layer or the pixel electrode.

Referring to FIG. 2D, the cutting marks are arranged alternatively based on their materials, and thus the position shift between the actual cutting position and the predetermined cutting position is clearly shown through the colors of the cutting marks.

In another embodiment, the shapes and the colors are combined to the cutting marks, and the shape and color of each cutting mark can be adjusted or designed based on the actual demands.

Next, a method of fabricating a TFT array substrate is described.

FIGS. 3A-3J are cross-sectional views of a method of fabricating a TFT array substrate according to an embodiment of the invention, wherein only one pixel structure is shown in the figures for clearly illustration.

Referring to FIG. 3A, a substrate 300 is provided. The substrate 300 has a device region 301a and a cutting mark region 301b. The substrate 300 can be a glass substrate or other transparent substrate. A first conductive layer 302 is formed on the substrate 300. The first conductive layer 302 can be fabricated from chromium (Cr), tungsten (W), tantalum (Ta), titanium (Ti), molybdenum (Mo), aluminum (Al) layer or other suitable conductive materials.

Referring to FIG. 3B, the first conductive layer 302 is patterned to form gates 303a within the device region 301a and form at least a first cutting mark 303b within the cutting mark region 301b simultaneously. That is, the first cutting mark 303b and the gates 303a are formed from patterning the first conductive layer 302.

Figure 3C:
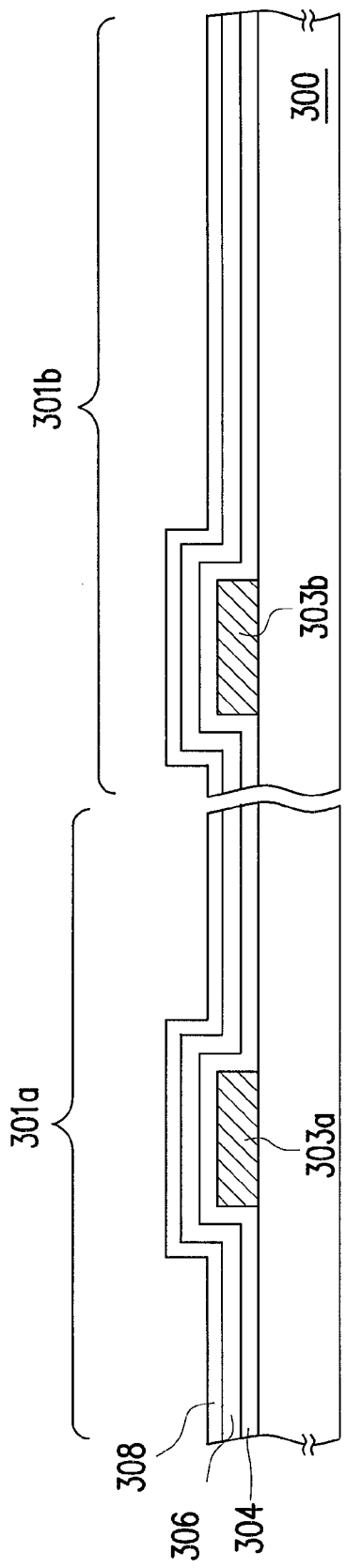

Referring to FIG. 3C, a dielectric layer 304 and a semiconductor layer 306 are formed over the substrate 300 to cover the gates 303a and the first cutting mark 303b. The dielectric layer 304 is also used as a gate insulating layer and the material thereof is silicon oxide, silicon nitride, silicon oxynitride or other dielectric material. The semiconductor layer 306 is an amorphous silicon layer, for example. According to another embodiment, an ohmic contact material layer 308 is further formed on the semiconductor layer 306, and the material of the ohmic material contact layer 308 is doped amorphous silicon, for example.

Figure 3D:
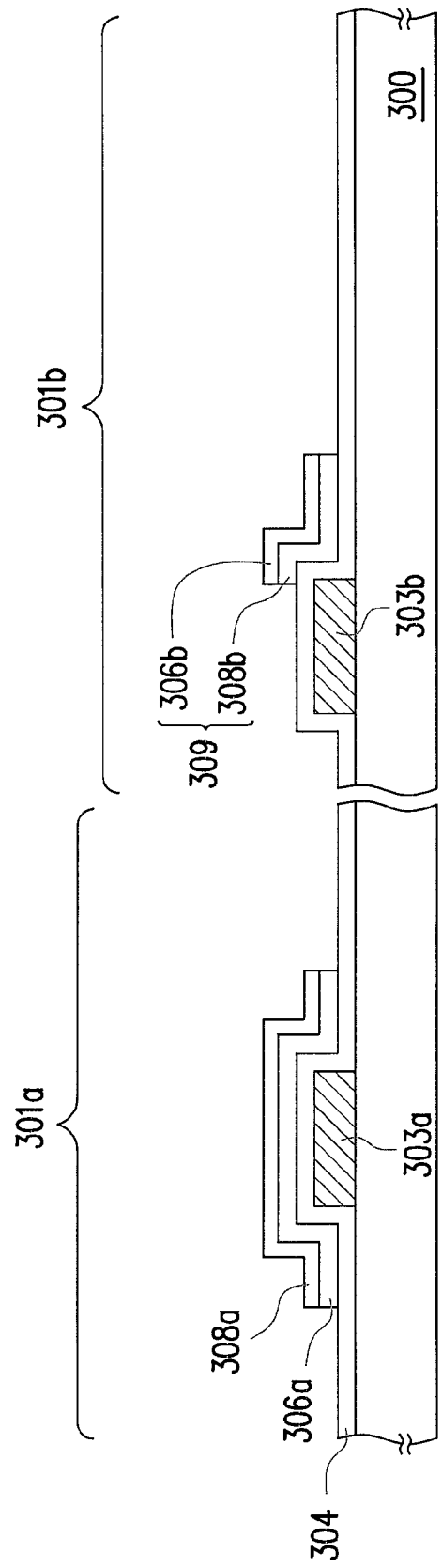

Next, as shown in FIG. 3D, the ohmic contact material layer 308 and the semiconductor layer 306 are patterned to form a channel layer 306a and an ohmic contact layer 308a on the dielectric layer 304 over the each of the gates 303a and form at least a second cutting mark 309 on the dielectric layer 304 within the cutting mark region 301b simultaneously. That is, the second cutting mark 309 is constituted of the semiconductor layer 306b and the ohmic contact layer 308b in the cutting mark region 301b. In the embodiment, the second cutting mark 309 is formed adjacent to a side of the first cutting mark 303b.

Referring to FIG. 3E, a second conductive layer 310 is formed over the substrate 300. The second conductive layer 310 can be fabricated from chromium (Cr), tungsten (W), tantalum (Ta), titanium (Ti), molybdenum (Mo), aluminum (Al) layer or other suitable conductive materials.

Referring to FIG. 3F, the second conductive layer 310 and the ohmic contact layer 308a within the device region 301a are patterned such that the channel layer 306a above each of the gates 303a is exposed and a source 311a and a drain 311b are formed beside the ohmic contact layer 308a above each of the gates 303a. Specifically, at least a third cutting mark 311c is formed on the dielectric layer 304 within the cutting mark region 301b during patterning the second conductive layer 310 period. Therefore, the third cutting mark 311c, the sources 311a and the drains 311b are made from patterning the second conductive layer 310. In the embodiment, the third cutting mark 311c is formed adjacent to a side of the second cutting mark 309.

Referring to FIG. 3G, a passivation layer 312 is formed over the substrate 300. A material of the passivation layer 312 is, for example, silicon nitride, silicon oxide or any other appropriate dielectric material.

Referring to FIG. 3H, the passivation layer 312 is patterned to form a patterned passivation layer 313a in the device region 301a, wherein the passivation layer 313a has contact openings 314 exposing the drains 311b. Specifically, at least a fourth cutting mark 313b is formed on the dielectric layer 304 within the cutting mark region 301b during patterning the passivation layer 312 period. That is, the fourth cutting mark 313b and the passivation layer 313a are formed from patterning the passivation layer 312. In the embodiment, the fourth cutting mark 313b is formed adjacent to a side of the third cutting mark 310c.

Figure 3I:
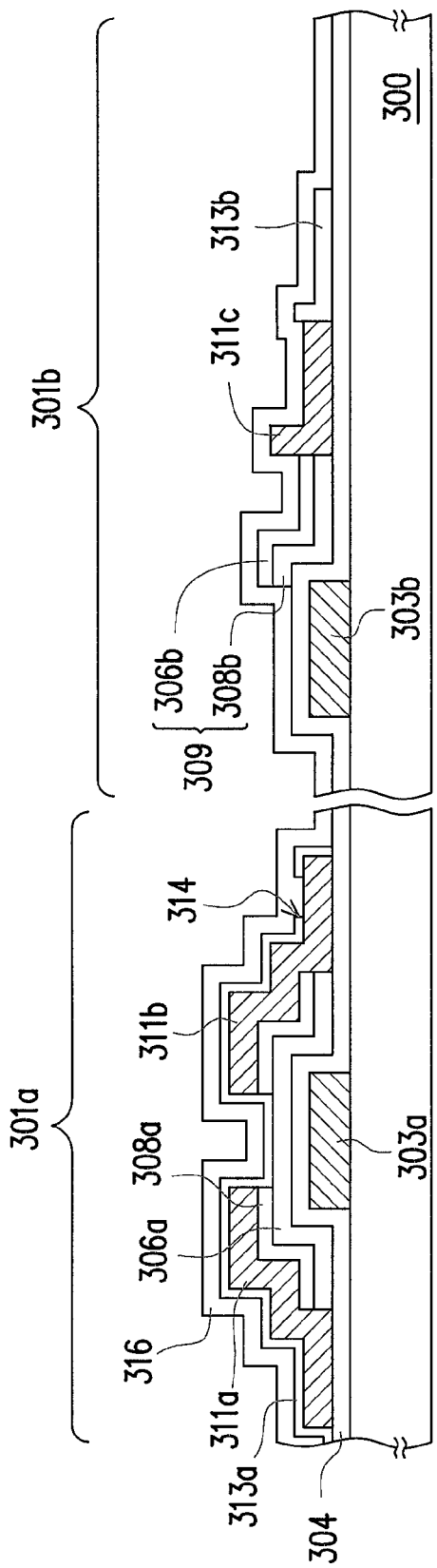

Referring to FIG. 3I, a transparent conductive material layer 316 is formed over the substrate 300, and a material of the transparent conductive material layer 316 is indium tin oxide (ITO) or other transparent conductive materials.

Figure 3J:
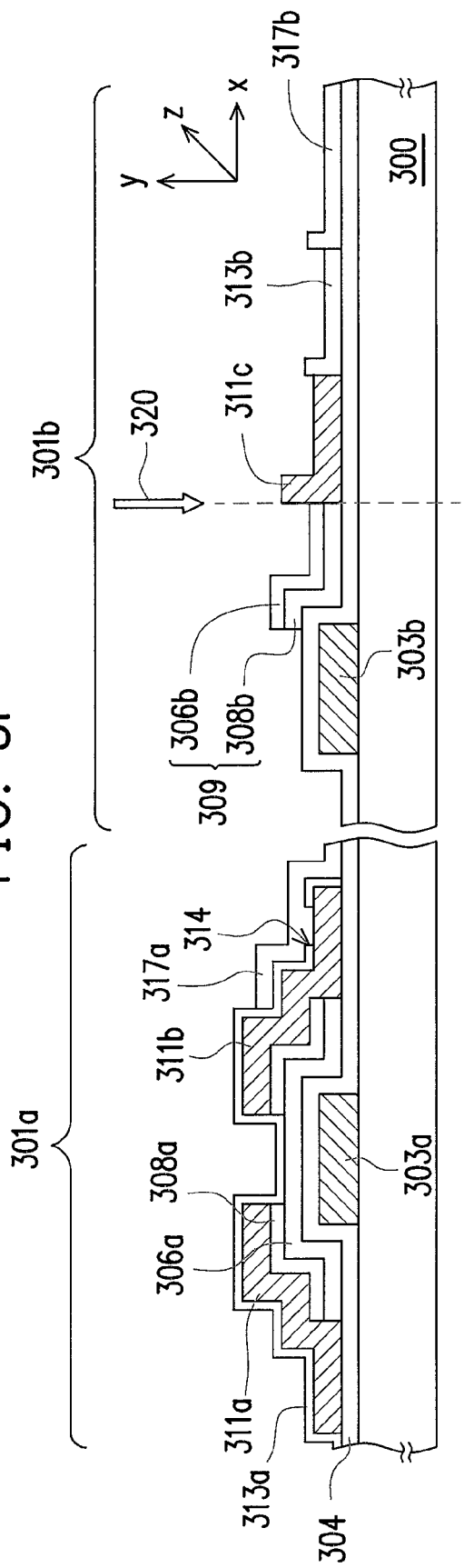

Referring to FIG. 3J, the transparent conductive material layer 316 is patterned to form pixel electrodes 317a electrically connecting with the drains 311b through the contact openings 314. Specifically, at least a fifth cutting mark 317b is formed on the dielectric layer 304 within the cutting mark region 301b during patterning the transparent conductive material layer 316 period. That is, the fifth cutting mark 317b and the pixel electrode 317a are formed from patterning the transparent conductive material layer 316. In the embodiment, the fifth cutting mark 317b is formed adjacent to a side of the fourth cutting mark 313b. Till now, the process of fabricating a TFT array substrate almost has been finished.

In FIG. 3J, the reference number 320 represents the predetermined cutting position, and it is located at the junction between the second cutting mark 309 and the third cutting mark 311c, and the predetermined cutting direction is z direction. The first cutting mark 303b, the second cutting mark 309, the third cutting mark 311c, the fourth cutting mark 313c, and the fifth cutting mark 317b are arranged as a raw or a column (along x direction) perpendicular to the predetermined cutting direction. These cutting marks 303b, 309, 311c, 313b, and 317b are formed at two sides of the predetermined cutting position 320, such that the position shift between the actual cutting position and the predetermined cutting position is clearly shown, and thus the accuracy of the cutting process is increased.

In the embodiment, the cutting marks 303b, 309b 311c, 313b, and 317b are arranged adjacent to each other. However, the above mentioned fabricating method is merely one embodiment and it does not limit the present invention. The arrangement of the cutting marks is not specifically limited. According to another embodiment, the first cutting mark 303b is formed firstly, and the second cutting mark 309 is formed and a specific distance is existed between the first and second cutting marks 303b, 309. Then, the third cutting mark 311c is formed and a specific distance is existed between the second and third cutting marks 309, 311c. Next, the fourth cutting mark 313b is formed between the first cutting mark 303b and the second cutting mark 309, and the fifth cutting mark 317b is formed between the second cutting mark 308 and the third cutting mark 311c (this arrangement is not shown in the figures). Naturally, the arrangement of the cutting marks formed in each patterning step can be adjusted and designed based on actual demands, and the one skilled in the art can practice the embodiment according to the description of the specification.

In addition, in the embodiment, each cutting mark is formed when each patterning step is performed. However, the number of the cutting mark is not limited in the present invention. Instead, the number of the cutting mark can be adjusted based on actual demands. For example, a plurality of cutting marks may be formed when one patterning step is performed, and the number of the cutting mark in each patterning step may be different.

Moreover, since the cutting marks are formed within the cutting mark region as the patterning steps are performed, these cutting marks may also serve as alignment marks between the film layers so as to increase the aligning accuracy of the film layers.

Because the TFT array substrate has a plurality of cutting marks having the combination of color and shape thereon, the position shift between an actual cutting position and the predetermined cutting position can be obtained through the cutting marks. Therefore, the cutting process can be adjusted according to the position shift so as to improve process yield. In addition, the cutting marks are formed when the patterning steps of the TFT array process is performed. Thus, the method is easy and does not increase the manufacturing cost. Moreover, the cutting marks may also serve as alignment marks between the film layers so as to increase the aligning accuracy between the film layers.

Although the present invention has been disclosed by the above embodiments, they are not intended to limit the present invention. Anybody skilled in the art may make some modifications and alterations without departing from the spirit and scope of the present invention. Therefore, the protection range of the present invention falls in the appended claims.

What is claimed is:

1. A thin film transistor (TFT) array substrate, comprising:
a substrate having a device region and a cutting mark region;
a plurality of pixel structures disposed in the device region, each pixel structure comprising a TFT, a pixel electrode and a passivation layer covering the TFT; and
a plurality of cutting marks disposed in the cutting mark region, the cutting marks being symmetrically disposed at two sides of a predetermined cutting position and all of the cutting marks being connected to one another so as to arrange into a straight line perpendicular to a predetermined cutting direction, wherein the adjacent cutting marks are connected to each other but are not overlapped to each other, and the cutting marks are constituted of at least two colors, at least two shapes, at least one color and at least one shape, or a combination thereof,
wherein each of the cutting marks has a width perpendicular to the predetermined cutting direction, and the widths of all of the cutting marks are the same such that the distance between each cutting mark and the predetermined cutting position is a multiple of a constant.

2. The TFT array substrate of claim 1, wherein all of the cutting marks have the same shape but have different colors.

3. The TFT array substrate of claim 1, wherein all of the cutting marks have different shapes.

4. The TFT array substrate of claim 1, wherein parts of the cutting marks have the same shape and the other parts of the cutting marks have different shapes.

5. The TFT array substrate of claim 1, wherein the cutting marks are arranged alternatively based on their materials.

6. The TFT array substrate of claim 1, wherein the cutting marks are arranged alternatively based on their shapes.

7. The TFT array substrate of claim 1, wherein the material of a portion of the cutting marks is the same to that of the gate of the TFT.

8. The TFT array substrate of claim 1, wherein the material of a portion of the cutting marks is the same to that of the semiconductor layer of the TFT.

9. The TFT array substrate of claim 1, wherein the material of a portion of the cutting marks is the same to that of the source and the drain of the TFT.

10. The TFT array substrate of claim 1, wherein the material of a portion of cutting marks is the same to that of the passivation layer.

11. The TFT array substrate of claim 1, wherein the material of a portion of the cutting marks is the same to that of the pixel electrode.

* * * * *